(12) United States Patent
Roziere

(10) Patent No.: US 10,396,784 B2
(45) Date of Patent: Aug. 27, 2019

(54) PRESSURE-SENSITIVE CAPACITIVE MEASUREMENT DEVICE AND METHOD FOR TOUCH-SENSITIVE AND CONTACTLESS INTERFACES

(71) Applicant: QUICKSTEP TECHNOLOGIES LLC, Wilmington, DE (US)

(72) Inventor: Didier Roziere, Nimes (FR)

(73) Assignee: QUICKSTEP TECHNOLOGIES LLC, Wilmington, DE (US)

( * ) Notice: Subject to any disclaimer, the term of this patent is extended or adjusted under 35 U.S.C. 154(b) by 0 days.

(21) Appl. No.: 14/368,019

(22) PCT Filed: Dec. 18, 2012

(86) PCT No.: PCT/FR2012/052972
§ 371 (c)(1),
(2) Date: Jun. 23, 2014

(87) PCT Pub. No.: WO2013/093326
PCT Pub. Date: Jun. 27, 2013

(65) Prior Publication Data
US 2014/0360854 A1    Dec. 11, 2014

(30) Foreign Application Priority Data

Dec. 21, 2011   (FR) .................................. 11 62125

(51) Int. Cl.
*G01L 1/04* (2006.01)
*G01L 1/14* (2006.01)
(Continued)

(52) U.S. Cl.
CPC ............ *H03K 17/9622* (2013.01); *G01L 1/04* (2013.01); *G01L 1/14* (2013.01); *G01R 27/2605* (2013.01);
(Continued)

(58) Field of Classification Search
CPC .................. G06F 3/044; G06F 3/0414; G06F 2203/04107; G06F 2203/04104
(Continued)

(56) References Cited

U.S. PATENT DOCUMENTS 5,483,261 A   1/1996 Yasutake
5,488,204 A   1/1996 Mead et al.
(Continued)

FOREIGN PATENT DOCUMENTS

EP   1840715 A2   3/2007
EP   2 267 791 A2   10/2010
(Continued)

OTHER PUBLICATIONS

French Search Report, dated Jul. 4, 2012, from corresponding FR application.
(Continued)

*Primary Examiner* — Jonathan M Dunlap
(74) *Attorney, Agent, or Firm* — Kubota & Basol LLP

(57) ABSTRACT

A capacitive measurement device for control interfaces, includes: (i) a support plate (2) having elements for attachment (4) to a control interface (3), (ii) first electrodes (5) arranged on a first surface of the support plate (2) opposite the control interface (3) and including first active electrodes (5), (iii) electronic capacitive measurement elements capable of enabling the obtainment of proximity and/or contact information of objects of interest (1), and (iv) second electrodes (6, 7) arranged on a second surface of the support plate (2) facing the control interface (3) and including second active electrodes (6) connected to the electronic capacitive measurement elements such as to enable the obtainment of measurements of movement and/or deformation of the support plate (2). A method and apparatus implemented in the device are also described.

17 Claims, 1 Drawing Sheet

(51) Int. Cl.
  *G06F 3/041* (2006.01)
  *G06F 3/044* (2006.01)
  *H03K 17/96* (2006.01)
  *G01R 27/26* (2006.01)

(52) U.S. Cl.
  CPC ............ *G06F 3/044* (2013.01); *G06F 3/0412* (2013.01); *G06F 3/0414* (2013.01); *G06F 3/0418* (2013.01); *G06F 2203/04107* (2013.01); *G06F 2203/04112* (2013.01); *H03K 2017/9613* (2013.01); *H03K 2217/0027* (2013.01); *H03K 2217/96077* (2013.01); *H03K 2217/960765* (2013.01)

(58) Field of Classification Search
  USPC ........ 345/174, 173, 156; 324/688, 658, 661, 324/662, 686
  See application file for complete search history.

(56) References Cited

U.S. PATENT DOCUMENTS

| | | | |
|---|---|---|---|
| 5,825,352 A | 10/1998 | Bisset et al. | |
| 5,835,079 A | 11/1998 | Shieh | |
| 5,844,506 A | 12/1998 | Binstead | |
| 5,880,411 A | 3/1999 | Gillespie et al. | |
| 5,942,733 A | 8/1999 | Allen et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 6,847,354 B2 | 1/2005 | Vranish | |
| 7,015,894 B2 | 3/2006 | Morohoshi | |
| 7,184,064 B2 | 2/2007 | Zimmerman et al. | |
| 7,570,064 B2 | 8/2009 | Roziere | |
| 7,663,607 B2 | 2/2010 | Hotelling et al. | |
| 8,149,002 B2 * | 4/2012 | Ossart | G01B 7/08 324/662 |
| 8,159,213 B2 | 4/2012 | Roziere | |
| 8,164,354 B2 * | 4/2012 | Lenz | H03K 17/955 324/687 |
| 8,479,122 B2 | 7/2013 | Hotelling et al. | |
| 8,487,905 B2 * | 7/2013 | Kandziora | G06F 3/0412 178/18.06 |
| 8,730,199 B2 * | 5/2014 | Sleeman | G01L 1/146 345/173 |
| 8,770,033 B2 | 7/2014 | Roziere | |
| 8,917,256 B2 * | 12/2014 | Roziere | G06F 3/044 178/18.06 |
| 8,933,710 B2 * | 1/2015 | Blondin | G06F 3/044 324/658 |
| 9,000,782 B2 * | 4/2015 | Roziere | G06F 3/044 324/688 |
| 9,035,903 B2 | 5/2015 | Binstead | |
| 9,075,491 B2 * | 7/2015 | Hotelling | G06F 3/0416 |
| 9,104,283 B2 * | 8/2015 | Roziere | G06F 3/0418 |
| 9,151,791 B2 * | 10/2015 | Roziere | G06F 3/044 |
| 9,151,792 B1 * | 10/2015 | Kremin | G01R 27/2605 |
| 9,201,547 B2 * | 12/2015 | Elias | G06F 3/044 |
| 9,250,757 B2 * | 2/2016 | Roziere | G06F 3/044 |
| 9,401,697 B2 * | 7/2016 | Blondin | G01R 27/2605 |
| 9,490,804 B2 * | 11/2016 | Hanumanthaiah | H03K 17/962 |
| 9,535,547 B2 * | 1/2017 | Roziere | G06F 3/044 |
| 2006/0022682 A1 * | 2/2006 | Nakamura | G01D 5/24 324/681 |
| 2006/0097733 A1 | 5/2006 | Roziere | |
| 2006/0197753 A1 | 9/2006 | Hotelling | |
| 2006/0227114 A1 * | 10/2006 | Geaghan | G06F 3/044 345/173 |
| 2006/0279548 A1 * | 12/2006 | Geaghan | G06F 3/0416 345/173 |
| 2007/0236466 A1 | 10/2007 | Hotelling | |
| 2008/0018608 A1 * | 1/2008 | Serban | G06F 3/0416 345/173 |
| 2008/0074098 A1 * | 3/2008 | Vranish | G01D 5/24 324/76.11 |
| 2008/0231292 A1 * | 9/2008 | Ossart | G01B 7/08 324/688 |
| 2008/0284261 A1 | 11/2008 | Andrieux et al. | |
| 2009/0033343 A1 * | 2/2009 | Reynolds | H03K 17/955 324/688 |
| 2009/0256818 A1 * | 10/2009 | Noguchi | G02F 1/13338 345/174 |
| 2010/0024573 A1 | 2/2010 | Daverman et al. | |
| 2010/0052700 A1 | 3/2010 | Yano et al. | |
| 2010/0200309 A1 * | 8/2010 | Yilmaz | G06F 3/016 178/18.03 |
| 2010/0328259 A1 * | 12/2010 | Ishizaki | G06F 3/044 345/174 |
| 2011/0007021 A1 * | 1/2011 | Bernstein | G06F 3/0416 345/174 |
| 2011/0057899 A1 * | 3/2011 | Sleeman | G01L 1/146 345/174 |
| 2011/0148811 A1 * | 6/2011 | Kanehira | G06F 3/044 345/174 |
| 2011/0169783 A1 | 7/2011 | Wang et al. | |
| 2011/0227872 A1 * | 9/2011 | Huska | G06F 3/016 345/174 |
| 2011/0291982 A1 * | 12/2011 | Hsieh | G06F 3/044 345/174 |
| 2012/0044662 A1 | 2/2012 | Kim et al. | |
| 2012/0162094 A1 * | 6/2012 | Kent | G06F 3/03547 345/173 |
| 2012/0162123 A1 * | 6/2012 | Kent | G06F 3/0418 345/174 |
| 2012/0187965 A1 * | 7/2012 | Roziere | G06F 3/044 324/688 |
| 2012/0188200 A1 * | 7/2012 | Roziere | G06F 3/044 345/174 |
| 2013/0018489 A1 * | 1/2013 | Grunthaner | G06F 3/041 700/73 |
| 2013/0135247 A1 | 5/2013 | Na et al. | |
| 2013/0307776 A1 | 11/2013 | Roziere | |
| 2014/0103712 A1 * | 4/2014 | Blondin | H02M 7/06 307/18 |
| 2014/0125357 A1 * | 5/2014 | Blondin | G06F 3/044 324/658 |
| 2014/0132335 A1 | 5/2014 | Rauhala et al. | |
| 2014/0145732 A1 * | 5/2014 | Blondin | G01R 27/2605 324/679 |
| 2014/0267165 A1 * | 9/2014 | Roziere | G06F 3/044 345/174 |
| 2014/0347321 A1 * | 11/2014 | Roziere | G06F 3/044 345/174 |
| 2015/0035792 A1 | 2/2015 | Roziere et al. | |

FOREIGN PATENT DOCUMENTS

| | | | |
|---|---|---|---|
| FR | 2756048 A1 | 5/1998 | |
| JP | 2000-163031 A | 6/2000 | |
| JP | 2002-342033 A | 11/2002 | |
| WO | 2006133018 A2 | 12/2006 | |
| WO | 2009126183 A2 | 10/2009 | |
| WO | WO 2011015794 A1 * | 2/2011 | G06F 3/044 |

OTHER PUBLICATIONS

International Search Report, dated May 6, 2013, from corresponding PCT application.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A

(56) References Cited

OTHER PUBLICATIONS

Dissertation Submitted to the Faculty of the University of Delaware in Partial Fulfillment of the Requirements for the Degree of Doctor of Philosophy in Electrical Engineering, 364 pages.

* cited by examiner

US 10,396,784 B2

PRESSURE-SENSITIVE CAPACITIVE MEASUREMENT DEVICE AND METHOD FOR TOUCH-SENSITIVE AND CONTACTLESS INTERFACES

TECHNICAL FIELD

The present invention relates to a pressure-sensitive capacitive measurement device for producing touch-sensitive and contactless human-machine interfaces. It also relates to a pressure-sensitive capacitive measurement method.

The field of the invention is more particularly but non-limitatively that of touch-sensitive and contactless human-machine interfaces.

STATE OF THE PRIOR ART

Many devices used for communication and for work use a touch-sensitive or contactless command interface such as a pad or a screen. This type of interface can be found for example in mobile telephones, smartphones, computers with touch-sensitive screens, pads, PCs, mouse devices, touch pads and widescreens etc.

These interfaces frequently use capacitive technologies. The touch-sensitive surface is provided with conductive electrodes connected to electronic means, which make it possible to measure the variation of the capacitances appearing between the electrodes and the object to be detected in order to give a command.

It is possible to produce transparent electrodes, which make it possible to superimpose an interface on a display screen, for example of a smartphone.

Most of these interfaces are touch-sensitive, that is they can detect contact between one or more command object(s) (usually fingers) and the surface of the interface.

Gestural or contactless interfaces are increasingly being developed which are capable of detecting command objects that are farther from the interface, without contact with the surface.

Two broad technical categories exist for capacitive measurement for command interfaces:

Techniques for the direct measurement of coupling capacitance between the objects of interest and the measurement electrodes. The electrodes are distributed so as to cover the measurement surface. They can be constituted by adjacent surfaces (patches) covering the entire surface, or by intersecting rows and columns. The capacitance between each electrode and any command objects is measured sequentially by detection electronics connected to the electrodes by scanners or other switching means;

Techniques for the measurement of coupling variation between electrodes. The electrodes are distributed in the form of intersecting rows and columns covering the measurement surface and forming respectively excitation electrodes and measurement electrodes. Detection electronics sequentially measure the coupling capacitance that appears between these excitation and measurement electrodes at their areas of overlap. The proximity of command objects disturbs this coupling capacitance, allowing them to be detected.

The development of contactless interfaces requires the implementation of very highly sensitive capacitive measurement techniques that provide a high degree of immunity to environmental interference. In fact, the capacitance created between capacitive measurement electrodes of the interface and command objects is inversely proportional to the distance separating them.

Document FR 2 756 048 by Rozière is known for example, which discloses a method of capacitive measurement that makes it possible to measure the capacitance and the distance between a plurality of independent electrodes and a nearby object.

This technique makes it possible to obtain capacitive measurements between the electrodes and the objects with a high resolution and sensitivity, making it possible to detect for example a finger at a distance of several centimeters, even ten centimeters. The detection can be done in three-dimensional space (XYZ) but also on a surface, in a plane (XY).

Although contactless interfaces are becoming increasingly important, touch nevertheless retains its importance, even in virtual interfaces capable of detecting movements at a distance, in particular for psychological and security reasons. In fact, on the one hand the tactile sensation contributes to user comfort, on the other touch allows effective validation of instructions in contexts of use where safety is important (medical equipment, vehicles).

Now, in the existing capacitive devices, detection of the contact is in general a detection of the fact that the distance between the command objects and the electrodes is very small. In particular there is no detection of pressure or pushing force allowing a contact to be validated.

Detection of the contact becomes more complex when the user wears a glove as, despite the physical contact, the capacitance created between the finger and the screen can be below the predetermined value that triggers the detection of the touch.

An object of the present invention is to propose a touch-sensitive and contactless interface that also makes it possible to detect a push or a pressure.

Another object of the present invention is to propose such an interface which can easily and cost-effectively be incorporated into a display device in devices of the smartphone type.

DISCLOSURE OF THE INVENTION

This objective is achieved with a capacitive measurement device for command interfaces, comprising:

a support plate made from a dielectric material, with means for fixing onto a command interface, first electrodes made from a substantially electrically conductive material, arranged on a first face of said support plate opposite the command interface, and comprising first active electrodes, electronic capacitive measurement means suitable for allowing data on the approach and/or contact of (an) object(s) of interest to be obtained by measurements of capacitive coupling with said first active electrodes, characterized in that it also comprises second electrodes made from a substantially electrically conductive material, arranged on a second face of said support plate toward the command interface, and comprising second active electrodes connected to said electronic capacitive measurement means so as to allow measurements of the displacement and/or deformation of said support plate to be obtained by measurement of capacitive coupling between said second active electrodes and said command interface. The first and second electrodes can moreover comprise respectively first and second guard electrodes excited at an alternating electric guard potential substantially identical to that of the first and second active electrodes, said first and second guard electrodes being arranged so as to electrically shield, respectively, on their face oriented toward the support plate, the second and first active electrodes.

The device according to the invention can also comprise switching means capable of connecting the first and second electrodes, either to the electronic capacitive measurement means or to the guard potential.

According to embodiments, the device according to the invention can also comprise electronic capacitive measurement means configured so as to make it possible to obtain data on the approach and/or contact of (an) object(s) of interest by measurements of capacitance between first active electrodes and the object(s) of interest.

According to further embodiments, the device according to the invention can also comprise first active electrodes with excitation electrodes and measurement electrodes capacitively coupled to said excitation electrodes, and electronic capacitive measurement means configured so as to make it possible to obtain data on the approach and/or contact of (an) object(s) of interest by measurements of the variation of coupling capacitance between said excitation and measurement electrodes.

The device according to the invention can also comprise electronic capacitive measurement means configured so as to make it possible to obtain measurements of displacement and/or deformation of said support plate by measurements of capacitance between said second active electrodes and said command interface.

The device according to the invention can also comprise electronic capacitive measurement means at least in part referenced to a reference electrical potential which is floating with respect to a ground potential.

The reference electrical potential can be substantially equal to the guard potential.

According to another aspect, a capacitive measurement method for command interfaces is proposed, utilizing (i) a support plate made from a dielectric material with means for fixing onto a command interface, (ii) first electrodes made from a material that is substantially electrically conductive, arranged on a first face of said support plate opposite the command interface, said first electrodes comprising first active electrodes, (iii) electronic capacitive measurement means, this method comprising a step of obtaining data on the approach and/or contact of (an) object(s) of interest by measurement of capacitive coupling with said first active electrodes, said method also comprises a step of obtaining measurements of displacement and/or deformation of said support plate by measurements of capacitive coupling between second active electrodes and said command interface, said second active electrodes (i) belonging to a group of second electrodes made from a material that is substantially electrically conductive arranged on a second face of said support plate toward the command interface and (ii) being connected to said electronic capacitive measurement means.

The method according to the invention can also comprise the steps of:

connecting first electrodes to the electronic capacitive measurement means, and second electrodes to the guard potential by switching means, obtaining data on the approach and/or contact of (an) object(s) of interest, connecting second electrodes to the electronic capacitive measurement means, and first electrodes to the guard potential by switching means, obtaining data on displacement and/or deformation of the support plate, obtaining data on the approach and/or contact of (an) object(s) of interest, when at least one object of interest is at a distance less than a predetermined distance, or in contact with the first electrodes, for obtaining data on displacement and/or deformation of the support plate, determining a pushing force and/or a pressure from data on displacement and/or deformation of the support plate.

According to another aspect, a human-machine interface device is proposed, comprising a command interface and a capacitive measurement device according to the invention.

The human-machine interface device according to the invention can comprise a command interface provided with a display screen, and a capacitive measurement device provided with a support plate and electrodes that are substantially transparent.

According to yet another aspect, a device is proposed, for example of one of the following types: smartphone, tablet, display screen, computer, control pad for a machine or vehicle, comprising a human-machine interface device according to the invention.

DESCRIPTION OF THE FIGURES AND EMBODIMENTS

Other advantages and features of the invention will become apparent on reading the detailed description of implementations and embodiments which are in no way limitative, and from the following attached drawings.

A description will be given of an example embodiment of a device according to the invention making it possible to manufacture touch-sensitive and contactless interfaces for systems or devices such as mobile telephones (smartphones), tablets, computers or control pads.

Figure 1:
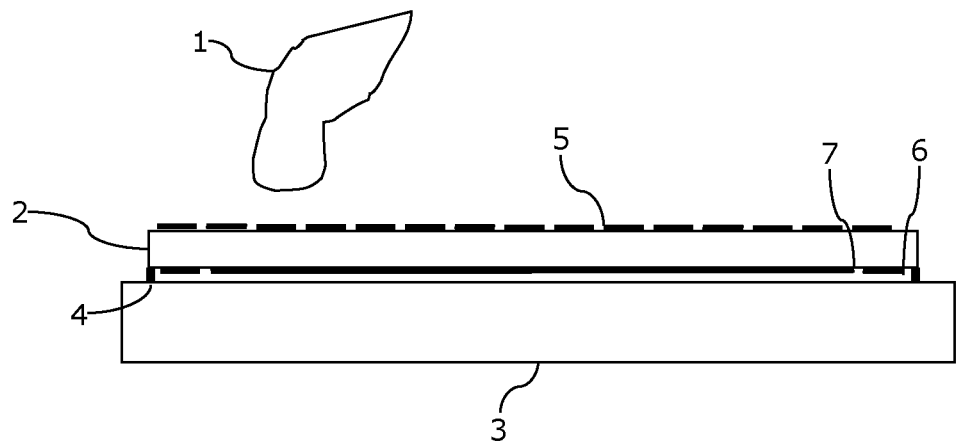
FIG. 1 shows a diagrammatic view in cross section of a device according to the invention.

With reference to FIG. 1, the capacitive measurement device according to the invention comprises a support plate 2 made from a substantially transparent dielectric material such as glass or a polymer such as PET.

This support plate 2 is fixed onto a command interface 3 by fixing means 4 suitable for deforming under the effect of pressure. These fixing means 4 can comprise for example springs or resilient materials.

The command interface 3 comprises a display screen, for example of the TFT (thin-film transistor) or OLED (organic light-emitting diode) type.

The command interface 3 and the superimposed capacitive measurement device constitute a human-machine interface for the system.

The support plate 2 comprises first electrodes 5 distributed over its face opposite to the command interface 3. These first electrodes 5 make it possible to detect the approach and/or contact of one or more object(s) of interest 1 such as a finger 1 by measurement of the capacitive coupling that is established between them and the finger 1.

The distance between the finger 1 and the electrodes 5 can be deduced from the capacitive coupling measurement, while the location of the finger 1 in the plane of the support plate 2 is obtained from the position of the first electrodes 5 which detect the presence of the finger 1.

The support plate 2 also comprises second electrodes 6, 7 on its face toward the command interface.

Some of these second electrodes, or second active electrodes 6, can be used for measuring distances between the support plate 2 and the command interface 3. These electrodes 6 are located on the edges and optionally toward the middle of the support plate 2.

The second electrodes also comprise second guard electrodes 7, excited at an alternating electrical guard potential.

The first electrodes 5 and the second electrodes 6, 7 are made from a substantially transparent material such as ITO (tin-doped indium oxide) deposited on the support plate 2. Some electrodes placed on the periphery of the support plate 2 and outside the transparent surface can be made from a non-transparent material.

The support plate 2 can be deformed and/or displaced toward the command interface 3 under the effect of a pressure exerted by the finger 1.

Figure 2:
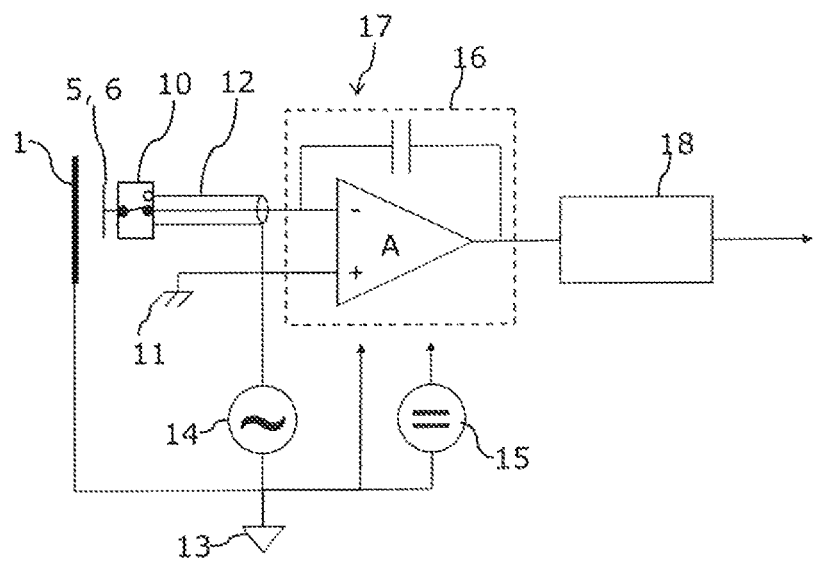
FIG. 2 shows an embodiment of the detection electronics.

With reference to FIG. 2, the first electrodes 5 and the second active electrodes 6 are connected to electronic capacitive measurement means 17.

These electronic capacitive measurement means 17, in the embodiment in FIG. 2, are provided in the form of a floating capacitive measuring bridge system as described for example in document FR 2 756 048 by Rozière.

The detection circuit comprises a part known as a floating part 16 the reference potential 11 of which, called guard potential 11, oscillates with respect to the ground 13 of the overall system, or to the earth. An excitation source, or an oscillator 14 generates the alternating potential difference between the guard potential 11 and the ground 13.

The floating part 16 comprises the sensitive part of the capacitive detection system, represented in FIG. 2 by a charge amplifier. It can of course also comprise other means of processing and conditioning the signal, including digital means or microprocessor-based means, also referenced to the guard potential 11. These means of processing and conditioning make it possible, for example, to calculate data relating to distance and pressure from capacitive measurements.

The power supply of the floating part 16 is ensured by floating power transfer means 15, comprising for example DC/DC converters.

This capacitive measurement system makes it possible to measure an item of capacitance data between at least one measurement electrode, which can be a first electrode 5 or a second active electrode 6, and an object such as, respectively, the finger 1 or the command interface 3.

The object to be detected 1 must be connected to a potential different from the guard potential 11, such as for example the ground potential 13. This configuration is met for the finger 1 of a user, whose body defines a 20 ground, and for the command interface 3, which is an electronic system referenced overall to the ground 13.

An array of switches or analogue switches 10, controlled by electronic control means, makes it possible to select a measurement electrode 5, 6 and connect it to the capacitive detection electronics 17 in order to measure the coupling capacitance thereof with the object 1 or the command interface 3, respectively. The switches 10 are configured in such a way that an electrode 5, 6 is connected either to the capacitive detection electronics 17, or to the guard potential 11.

A guard shield 12 connected to the guard potential 11 protects the sensitive part of the detection system. Similarly, the electrodes 5, 6 which are not active are connected to the guard potential 11 by the switches 10. The device also comprises guard electrodes, including the second guard electrodes 7, which remain connected to the guard potential 11.

Thus, an active electrode 5, 6 connected by a switch 10 to the capacitive detection electronics 17 is surrounded, in particular on its rear face, by guard planes constituted at least partially by first and/or second electrodes 5, 6, 7 connected to the guard potential 11.

As the active measurement electrode 5, 6 is also at the guard potential 11, it is therefore possible to avoid stray capacitances between this electrode and its surroundings in such a way that only the coupling with the object of interest 1 is measured with a maximum sensitivity.

The floating electronics 16 are connected at the output to the system electronics 18 referenced to ground by electrical connections that are compatible with the difference in reference potentials. These connections can comprise for example differential amplifiers or optocouplers.

A measurement method implemented in the device according to the invention will now be described.

Firstly, the second electrodes 6, 7 are all connected to the guard potential. The scanners 10 sequentially poll the first active electrodes 5 in order to detect the approach of command objects 1.

When a command object is identified close to or in contact with first electrodes 5, the scanners 10 are controlled so as to also poll second active electrodes 6. The measurements obtained from these second active electrodes 6 make it possible to obtain data on displacement and/or deformation of the support plate 2, from which it is possible to deduce data on pressure exerted by the command object 1 on the support plate 2.

When second active electrodes 6 are connected to the electronics 17, the first electrodes 5, or at least those placed opposite the second active electrodes 6, are connected to the guard potential 11.

As a result of this arrangement of the guard planes, it is ensured that the first active electrodes 5 are only sensitive to objects found on their side of the support plate 2, while the second active electrodes 6 are only sensitive to the presence of the command interface 3.

Data on the position of the object or the objects 1 in space relative to the support plate 3 and data on pushing or pressure exerted on this support plate 3 are obtained in this way.

These data are processed by the detection electronics 17 and transmitted to the system electronics 18 to be utilized in particular in the human-machine interface.

The pressure or pushing data reliably obtained by the device and the method according to the invention make it possible to obtain a validation of commands that is more certain and more comfortable for the user. It also makes it possible to add a dimension or a degree of freedom to the human-machine interface, by allowing a distinction between a light brush and a push, or even commands proportional to the pressure exerted.

According to variants:

The support plate 2 can be sufficiently flexible to deform under the effect of an exerted pressure, and to be fixed by flexible or rigid fixing means 4;

The first electrodes 5 and the second electrodes 6, 7 can be arranged on the same side of the support plate 2, in successive layers separated by isolating layers;

the first and second electrodes 5, 6, 7 can all be connected to the measurement electronics 17 by means of switches 10;

Several measurement electronics 17 can be utilized, each capable of being connected to a set of electrodes 5, 6, so as to be able to carry out a plurality of measurements in parallel;

"Intelligent" scanning strategies can be implemented, for detecting and monitoring objects 1 with a minimum of scanning operations. Conversely, the first and second active electrodes 5, 6 can all be scanned systematically, even in the absence of objects;

The second active electrodes 6 can be few in number, for example toward the edges, and detect only overall movements of the support plate 2. They can also be sufficient in number, distributed over the surface, to carry out mapping of the deformation of the support plate 2;

The first electrodes 5 can comprise electrodes in the form of intersecting rows and columns, for direct measurements of capacitance with the object 1, or measurements of coupling capacitance interference due to the presence of the object 1;

The measurements of displacement and/or deformation of the support plate 2 can comprise absolute measurements—in relation to a reference position and/or shape of the support plate 2—and/or relative measurements—i.e. measurements of variation of position and/or shape—. They can also comprise measurements of speed of displacement and/or deformation of the support plate 2, as well as all types of measurements relative to a displacement and/or a deformation. They can in particular comprise measurements making it possible to characterize a pressure exerted statically and/or dynamically.

It is noteworthy that an advantage of the invention is to be able to use the entire command interface 3 as a "target". This advantage is made possible due to the fact that the detection electronics are referenced to a defined-frequency alternating guard potential 11. It is thus possible to obviate the effect of the electrical signals referenced to the ground 13 which are present in the command interface 3.

According to another advantageous aspect, the support plate 2 supports all the electrodes 5, 6, 7 and the invention does not need any particular adaptation of its environment in order to operate. It can thus very easily be incorporated into a control interface 3 without the need for any particular adaptation of the display device for example.

Of course, the invention is not limited to the examples that have just been described and numerous adjustments can be made to these examples without exceeding the scope of the invention.

The invention claimed is:

1. A capacitive measurement device, comprising:
 a support plate made from a dielectric material, with a resilient material coupled to the support plate and configured for fixing the support plate onto a display referenced to a ground potential,
 first active electrodes made from an electrically conductive material, arranged on a first face of said support plate opposite the display and configured to receive a first potential different from the ground potential, wherein each of a plurality of the first active electrodes formed on a central area of the support plate are configurable for individually detecting an approach or contact of one or more objects of interest,
 an electronic capacitive measurement amplifier configured for allowing data on the approach or contact of the one or more objects of interest to be obtained by measurements of capacitive coupling with said first active electrodes, and
 second active electrodes made from an electrically conductive material, arranged on a second face of said support plate toward the display and configured to receive a second potential, the second active electrodes selectively connectable to said electronic capacitive measurement amplifier so as to allow measurements of one or both of a displacement and deformation of said support plate to be obtained by measurement of capacitive coupling between said second active electrodes and said display,
 wherein the electronic capacitive measurement amplifier is configurable for receiving a guard potential at a first input,
 wherein the electronic capacitive measurement amplifier is selectively couplable to the first active electrodes at a second input for generating the first potential, or to the second active electrodes at the second input for generating the second potential, and
 wherein the first and second potentials are referenced to the guard potential through the electronic capacitive measurement amplifier.

2. The device of claim 1, further comprising one or more guard electrodes configured for receiving the guard potential, the guard potential held at the first potential and different from the ground potential, said one or more guard electrodes being arranged so as to electrically shield, respectively, on their face oriented toward the support plate, the first active electrodes.

3. The device according to claim 2, further comprising plurality of switches configured for connecting either the first active electrodes or the second active electrodes, to the electronic capacitive measurement amplifier or to the guard potential.

4. The device of claim 2, wherein the electronic capacitive measurement amplifier is at least partially referenced to the guard potential.

5. The device of claim 4, in which the first potential is equal to the guard potential.

6. The device of claim 1, wherein the electronic capacitive measurement amplifier is configured for obtaining data on the approach or the contact of the one or more objects of interest by capacitance measurements between each of the plurality of the first active electrodes and the one or more objects of interest.

7. The device of claim 1, the first active electrodes including excitation electrodes and measurement electrodes, the measurement electrodes configurable for being capacitively coupled to said excitation electrodes, and wherein the electronic capacitive measurement amplifier is configurable for obtaining data on the approach or the contact of the one or more objects of interest by measurements of the variation of coupling capacitance between said excitation and measurement electrodes.

8. The device of claim 1, wherein the electronic capacitive measurement amplifier is configurable for obtaining measurements of one or both of the displacement and deformation of said support plate by measurements of capacitance between said second active electrodes and said display.

9. A human-machine interface device comprising the display and the electronic capacitive measurement amplifier according to claim 1.

10. The human-machine interface device according to claim 9 wherein the display is provided with a display screen, and the electronic capacitive measurement amplifier is coupled to the support plate and the first active electrodes which are transparent.

11. A device of one of the following types: smartphone, tablet, display screen, computer, control pad for a machine or vehicle, comprising the human-machine interface device according to claim 9.

12. A capacitive measurement method, utilizing (i) a support plate made from a dielectric material with a resilient material coupled to the support plate and configured for fixing onto a display referenced to ground potential, (ii) first active electrodes made from a material that is electrically conductive, arranged on a first face of said support plate opposite the display, said first active electrodes configured to receive a first potential different from the ground potential, wherein each of a plurality of the first active electrodes formed on a central area of the support plate are configurable for individually detecting an approach or contact of one or more objects of interest, and (iii) an electronic capacitive measurement amplifier, the method comprising:

obtaining data on the approach or contact of the one or more objects of interest by measurement of capacitive coupling with said first active electrodes, obtaining measurements of one or both of a displacement and deformation of said support plate by measurements of capacitive coupling between second active electrodes and said display, said second active electrodes (i) made from a material that is electrically conductive, arranged on a second face of said support plate toward the display and (ii) receiving a second potential and being selectively connectable to said electronic capacitive measurement amplifier, receiving a guard potential at a first input of the electronic capacitive measurement amplifier, selectively coupling a second input of the electronic capacitive measurement amplifier to the first active electrodes for generating the first potential, or to the second active electrodes for generating the second potential, and referencing the first and second potentials to the guard potential through the electronic capacitive measurement amplifier.

13. The method of claim 12, further comprising:
  connecting the first active electrodes to the electronic capacitive measurement amplifier, and connecting the second active electrodes to the guard potential by plurality of switches,
  obtaining data on the approach or the contact of the one or more objects of interest.

14. The method of claim 12, further comprising:
  connecting the second active electrodes to the electronic capacitive measurement amplifier, and connecting the first active electrodes to the guard potential by a plurality of switches,
  obtaining data on one or both of the displacement and deformation of the support plate.

15. The method of claim 12, further comprising:
  obtaining data on the approach or the contact of the one or more objects of interest, and
  when at least one object of interest is at a distance less than a predetermined distance, or in contact with at least one of the first active electrodes, obtaining data on one or both of the displacement and deformation of the support plate.

16. The method of claim 12, further comprising determining one or both of a pushing force and a pressure from data on one or both of the displacement and deformation of the support plate.

17. A device of one of the following types: smartphone, tablet, display screen, computer, control pad for a machine or vehicle, configured for performing the method according to claim 12.

* * * * *